US006507077B2

(12) United States Patent
Nakamura et al.

(10) Patent No.: US 6,507,077 B2
(45) Date of Patent: Jan. 14, 2003

(54) VOLTAGE NONLINEAR RESISTOR, METHOD FOR FABRICATING THE SAME, AND VARISTOR

(75) Inventors: Kazutaka Nakamura, Yasu-gun (JP); Yukihiro Kamoshida, Yokaichi (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/801,288

(22) Filed: Mar. 7, 2001

(65) Prior Publication Data

US 2001/0030353 A1 Oct. 18, 2001

(30) Foreign Application Priority Data

Mar. 15, 2000 (JP) ...................................... 2000-071888

(51) Int. Cl.[7] ................................................ H01L 29/80

(52) U.S. Cl. ..................... 257/380; 264/29.5; 264/29.6; 264/65; 264/125

(58) Field of Search .............................. 264/29.5, 29.6, 264/65, 125, 617, 662

(56) References Cited

U.S. PATENT DOCUMENTS 4,209,474 A * 6/1980 Prochazka ................. 252/504

* cited by examiner

*Primary Examiner*—Hoai Ho
*Assistant Examiner*—Mai-Huong Tran
(74) *Attorney, Agent, or Firm*—Dickstein, Shapiro, Morin & Oshinksky, LLP.

(57) ABSTRACT

A voltage nonlinear resistor is composed of an aggregate of silicon carbide particles doped with impurities, in which oxygen and at least one of aluminum and boron are diffused in the vicinity of the surfaces of the silicon carbide particles, the diffusion length of the oxygen is about 100 nm or less from the surfaces of the silicon carbide particles, and the diffusion length of at least one of the aluminum and the boron is in the range of about 5 to 100 nm from the surfaces of the silicon carbide particles. A method for fabricating a voltage nonlinear resistor and a varistor using a voltage nonlinear resistor are also disclosed.

13 Claims, 4 Drawing Sheets

VOLTAGE NONLINEAR RESISTOR, METHOD FOR FABRICATING THE SAME, AND VARISTOR

BACKGROUND OF THE INVENTION

1. Field of the Invention

The present invention relates to voltage nonlinear resistors and methods for fabricating the same, and to varistors.

2. Description of the Related Art

As the sizes of circuits are reduced and reference frequencies are increased, there are demands for electronic components which are small and suitable for higher frequencies. As the driving voltages for circuits are decreased, there are also demands for electronic components which can cope with decreased voltage. This trend also applies to varistors as abnormal-voltage absorbing devices.

As voltage nonlinear resistors, SiC-based varistors, ZnO-based varistors and $SrTiO_3$-based varistors are generally known. With respect to ZnO-based varistors and $SrTiO_3$-based varistors, monolithic chip varistors with a driving voltage of 3.5 V or more have been developed and commercially available.

In order to make a varistor suitable for higher frequencies and to use the varistor as a noise-absorbing device in a signal circuit, etc., the capacitance of the varistor must be decreased. In order to make the varistor suitable for decreased voltage, the varistor voltage must be reduced.

However, the conventional ZnO-based varistor has an apparent relative dielectric constant of 200 or more, and the apparent relative dielectric constant of the $SrTiO_3$-based varistor is higher than that of the ZnO-based varistor, at several thousands to several ten thousands. Therefore, in order to decrease the capacitance of the varistor, the total area of electrodes must be greatly decreased or the number of particle boundaries must be increased by increasing the thickness of the device between the electrodes. However, if the total area of electrodes is decreased, the surge current capacity is also decreased, and if the thickness of the device between the electrodes is increased, the varistor voltage is increased. If the varistor voltage is decreased, the capacitance of the varistor is further increased, and therefore, it has been difficult to make the low voltage and the low capacitance requirements compatible with each other.

With respect to the SiC-based varistor, since the apparent relative dielectric constant is low, the capacitance can be easily decreased. However, the SiC-based varistor has a lower voltage nonlinear coefficient a in comparison with other varistors. For example, in the ZnO-based varistor or the $SrTiO_3$-based varistor, the voltage nonlinear coefficient is several tens, while the SiC-based varistor has a voltage nonlinear coefficient of 8 at most. For the reasons described above, a voltage nonlinear resistor in which the capacitance is decreased, the voltage nonlinear coefficient a is increased and the varistor voltage is decreased, is not available at present.

SUMMARY OF THE INVENTION

Accordingly, it is an object of the present invention to provide a voltage nonlinear resistor in which the capacitance is decreased, the voltage nonlinear coefficient a is increased and the varistor voltage is decreased.

In order to achieve the object described above, the present inventors have conducted various experiments and examinations with respect to voltage nonlinear resistors composed of aggregates of n-type semiconductive SiC particles doped with impurities, such as $N_2$. As a result, it has been found that electrical characteristics of the voltage nonlinear resistors depend on the surface state of the SiC particles, and that oxygen must be diffused into the surfaces of SiC particles to a depth of about 100 nm or less and at least one element selected from the group consisting of A1 and B must be diffused into the surfaces of SiC particles to a depth of about 5 to 100 nm.

In one aspect of the present invention, a voltage nonlinear resistor is composed of an aggregate of silicon carbide particles doped with impurities, in which oxygen and at least one of aluminum and boron are diffused in the vicinity of the surfaces of the silicon carbide particles, the diffusion length of the oxygen is about 100 nm or less from the surfaces of the silicon carbide particles, and the diffusion length of at least one of the aluminum and the boron is in the range of about 5 to 100 nm from the surfaces of the silicon carbide particles.

Preferably, the diffusion length of the oxygen is in the range of about 25 to 85 nm from the surfaces of the silicon carbide particles. Preferably, the diffusion length of at least one of the aluminum and the boron is in the range of about 25 to 70 nm from the surfaces of the silicon carbide particles.

Preferably, the element ratio of silicon being present within about 10 nm from the surfaces of the silicon carbide particles to the at least one of the aluminum and the boron is about 1:0.5 to 3. By modifying the surfaces of the silicon carbide particles to such a state, it is possible to obtain a superior voltage nonlinear resistor which has a small capacitance and high $\alpha$, and which is resistant to surge and static electricity.

The average particle size of the silicon carbide particles is preferably in the range of about 0.3 to 70 $\mu$m and more preferably in the range of about 1 to 30 $\mu$m. By setting the average particle size of the silicon carbide particles in such a range, the varistor voltage can be controlled.

In another aspect of the present invention, a method for fabricating a voltage nonlinear resistor includes the steps of: adding at least one of aluminum and boron to silicon carbide powder doped with impurities; and heat-treating mixed powder obtained in an oxidizing atmosphere in order to form silicon carbide particles based on the silicon carbide powder, to diffuse at least one of the aluminum and the boron into the surfaces of the silicon carbide particles and to oxidize the surfaces of the silicon carbide particles. In such a case, the heat-treating temperature is preferably set at about 1,100 to 1,500° C.

In another aspect of the present invention, a method for fabricating a voltage nonlinear resistor includes the steps of: adding at least one of aluminum and boron to silicon carbide powder doped with impurities; heat-treating mixed powder obtained in a non-oxidizing atmosphere in order to form silicon carbide particles based on the silicon carbide powder and to diffuse at least one of the aluminum and the boron into the surfaces of the silicon carbide particles; and oxidizing the surfaces of the silicon carbide particles formed by the heat treatment. In such a case, the heat-treating temperature is preferably set at about 800 to 1,500° C.

DESCRIPTION OF THE PREFERRED EMBODIMENTS

Voltage nonlinear resistors, methods for fabricating the same, and varistors will be described with reference to the following examples.

EXAMPLE 1

Figure 1:
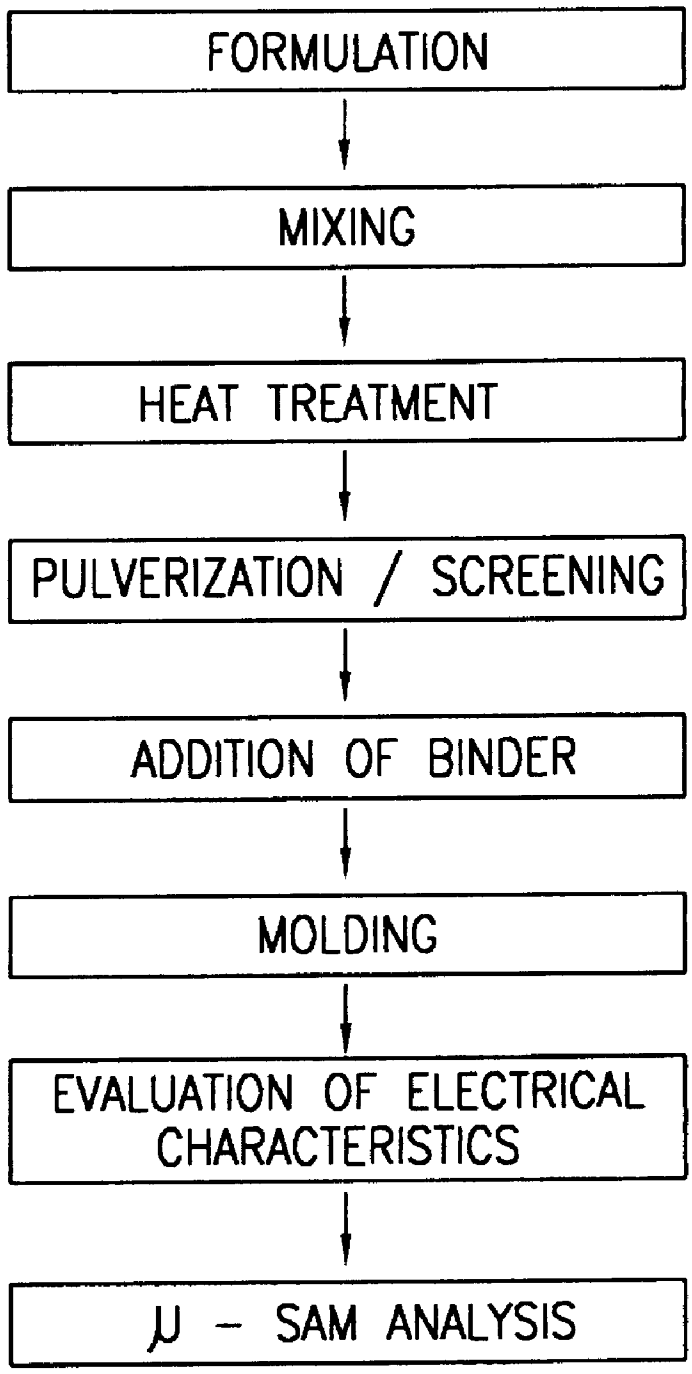
FIG. 1 is a flow chart showing a fabrication method in a first example.

As shown in the flow chart of FIG. 1, to n-type semiconductive β-SiC powder doped with 4,000 ppm of N as a dopant, having a particle size of 2 μm, boric acid and metallic aluminum were added so as to satisfy the A1 and B contents shown in Table 1. An organic solvent was added to the mixed powder and wet mixing was performed. The resultant mixed slurry was dried to remove the solvent, and then in order to form SiC particles based on the SiC powder, to diffuse A1 and B into the surfaces of SiC particles and to oxidize the surfaces of SiC particles, a heat treatment was performed in air at 1,100 to 1,500° C. The resultant powder was subjected to pulverization/screening. Hereinafter, the powder is referred to as voltage nonlinear powder. After an organic binder was mixed to the voltage nonlinear powder, a pressure of 3 t/cm$^2$ was applied to produce a columnar compact with a diameter of 4 mm and a thickness of 0.25 mm.

After the compact was hardened at 100 to 200° C., a pair of Ag electrodes with a diameter of 2 mm was formed as input/output electrodes on the upper and lower surfaces of the compact by sputtering, and varistor characteristics were evaluated. Furthermore, the voltage nonlinear powder was subjected to surface analysis using μ-SAM to observe the surface state.

In order to evaluate the varistor characteristics, a direct current was applied to measure the voltage between both terminals, and a voltage at 0.1 mA was defined as the varistor voltage $V_{0.1mA}$. The voltage nonlinear coefficient α as a performance index of the varistor was calculated according to the formula (1) below.

$$\alpha=1/\mathrm{Log}(V_{01mA}/V_{0.01mA}) \quad (1)$$

where $V_{0.01mA}$ is a voltage at 0.01 mA.

The results of the voltage nonlinear coefficient a and the varistor voltage are shown in Table 2.

Since the relative dielectric constant e determined based on the observed capacitance was in the range of 3 to 5 in all the samples, the constant ε is not listed.

Furthermore, the surge current capacity and the ESD susceptibility were measured. The results thereof are shown in Table 3. When a current wave with a waveform of 8×20 μsec was applied twice at an interval of one minute and the rate of change in varistor voltage was less than 5%, the maximum current (unit: A) was defined as the surge current capacity. The surge current was applied in steps of 20 A.

The ESD susceptibility was measured using a contact discharge-type ESD tester, in which 30 kV was charged at a charge capacitance of 500 pF and a discharge resistance of 0 Ω, and the samples were subjected to discharge. The symbol Ω indicates that the sample had a rate of change in varistor voltage of 5% or less, the symbol Δ indicates that the sample had a rate of change in varistor voltage of 10% or less, the symbol x indicates the sample's rate was other than the above. The designation *** means no determination was made.

Figure 2:
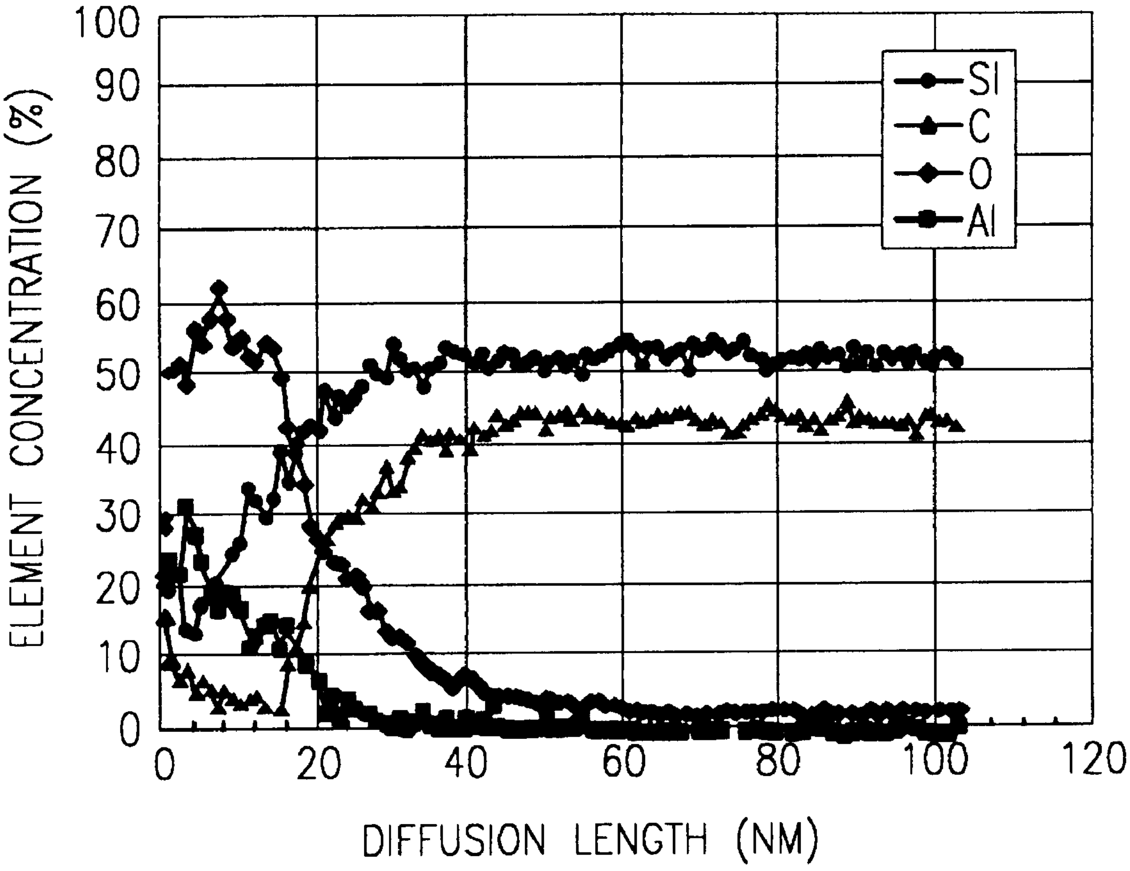
FIG. 2 is a graph showing the diffusion lengths of elements in the first example.

FIG. 2 shows a typical example of the results measured by the μ-SAM. Table 4 shows the diffusion lengths of oxygen (O), aluminum (A1) and boron (B) obtained based on the observed results by the μ-SAM. With respect to the diffusion length (A1·B), the distance (nm) from the surface to the point of 10.5 atomic % relative to the total element amount is shown. This is because of the fact that at the point of 0%, noise due to, for example, adsorbed elements during measurement, may occur and it is not possible to attain measurement accuracy. Additionally, since oxygen is easily adsorbed, the distance from the surface to the point of 10 atomic % is shown.

TABLE 1

| Sample No. | SiC (parts by weight) | Al (parts by weight) | B (parts by weight) |
|---|---|---|---|
| 1 | 100 | 0 | 0 |
| 2 | 100 | 0.001 | 0 |
| 3 | 100 | 0.01 | 0 |
| 4 | 100 | 0.1 | 0 |
| 5 | 100 | 1 | 0 |
| 6 | 100 | 10 | 0 |
| 7 | 100 | 100 | 0 |
| 8 | 100 | 0 | 0.001 |
| 9 | 100 | 0 | 0.01 |
| 10 | 100 | 0 | 0.1 |
| 11 | 100 | 0 | 1 |
| 12 | 100 | 0 | 10 |
| 13 | 100 | 0 | 100 |
| 14 | 100 | 0.1 | 0.1 |
| 15 | 100 | 1 | 1 |
| 16 | 100 | 10 | 10 |

TABLE 2

| Oxidation | 1,100° C. | | 1,200° C. | | 1,300° C. | | 1,400° C. | | 1,500° C. | |
|---|---|---|---|---|---|---|---|---|---|---|
| Temperature Sample No. | $V_{1mA}$ (V/mm) | α | $V_{1mA}$ (V/mm) | α | $V_{1mA}$ (V/mm) | α | $V_{1mA}$ (V/mm) | α | $V_{1mA}$ (V/mm) | α |
| 1 | 5,000 | 1.4 | 3,800 | 1.8 | 3,200 | 2.5 | 3,000 | 2.4 | *** | *** |
| 2 | 3,050 | 15.8 | 2,090 | 18.7 | 1,970 | 19.1 | 2,050 | 13.4 | 2,100 | 8.7 |
| 3 | 1,870 | 18.7 | 1,640 | 20.8 | 1,510 | 31.5 | 1,540 | 18.6 | 1,850 | 15.6 |
| 4 | 1,440 | 20.4 | 1,310 | 20.4 | 1,180 | 35.4 | 1,160 | 25.4 | 1,280 | 17.1 |
| 5 | 1,410 | 37.2 | 1,370 | 37.2 | 1,370 | 37.2 | 1,820 | 18.2 | *** | *** |
| 6 | 2,530 | 24.3 | 1,960 | 24.3 | 1,890 | 24.3 | *** | *** | *** | *** |
| 7 | 4,800 | 18.6 | 3,400 | 18.5 | *** | *** | *** | *** | *** | *** |
| 8 | 2,430 | 8.6 | 2,050 | 17.8 | 1,980 | 19.6 | 1,810 | 16.4 | 2,050 | 15.6 |
| 9 | 2,550 | 13.9 | 1,790 | 18.0 | 1,450 | 23.8 | 1,540 | 24.2 | 1,750 | 17.2 |
| 10 | 1,990 | 22.5 | 1,310 | 25.1 | 1,180 | 32.5 | 1,280 | 33.3 | 1,350 | 18.9 |
| 11 | 1,940 | 25.7 | 1,190 | 35.8 | 1,170 | 44.6 | 1,150 | 21.1 | 1,190 | 14.5 |
| 12 | 2,890 | 18.0 | 2,190 | 23.6 | 1,890 | 27.0 | 1,890 | 17.6 | *** | *** |
| 13 | 4,750 | 10.7 | 3,540 | 15.8 | 2,500 | 18.9 | 2,830 | 13.4 | *** | *** |
| 14 | 1,360 | 17.8 | 1,360 | 25.8 | 1,360 | 26.8 | 1,460 | 25.8 | 1,590 | 19.6 |
| 15 | 1,540 | 45.8 | 1,330 | 44.1 | 1,320 | 42.7 | 1,320 | 35.5 | 1,460 | 24.7 |
| 16 | 2,880 | 18.0 | 1,960 | 19.7 | 1,750 | 22.3 | 1,990 | 19.6 | *** | *** |

TABLE 3

| Oxidation Temperature | 1,100° C. | | 1,200° C. | | 1,300° C. | | 1,400° C. | | 1,500° C. | |
|---|---|---|---|---|---|---|---|---|---|---|
| Sample No. | Surge | ESD | Surge | ESD | Surge | ESD | Surge | ESD | Surge | ESD |
| 1 | * * * | * * * | * * * | * * * | * * * | * * * | * * * | * * * | * * * | * * * |
| 2 | 40 | ○ | 40 | Δ | 40 | ○ | 60 | ○ | 60 | Δ |
| 3 | 60 | ○ | 60 | ○ | 60 | ○ | 40 | ○ | 40 | Δ |
| 4 | 60 | ○ | 80 | ○ | 80 | ○ | 60 | ○ | 60 | Δ |
| 5 | 100 | ○ | 100 | ○ | 100 | ○ | 80 | ○ | * * * | * * * |
| 6 | 80 | ○ | 100 | ○ | 100 | ○ | * * * | * * * | * * * | * * * |
| 7 | 60 | x | 80 | Δ | 80 | Δ | * * * | * * * | * * * | * * * |
| 8 | * * * | * * * | 40 | ○ | 40 | ○ | 60 | ○ | 60 | Δ |
| 9 | * * * | * * * | 80 | ○ | 60 | ○ | 60 | ○ | 60 | Δ |
| 10 | 60 | ○ | 80 | ○ | 80 | ○ | 80 | ○ | 80 | Δ |
| 11 | 80 | ○ | 100 | ○ | 100 | ○ | 80 | ○ | * * * | * * * |
| 12 | 80 | ○ | 80 | ○ | 100 | ○ | 60 | ○ | * * * | * * * |
| 13 | * * * | * * * | 60 | Δ | 80 | Δ | * * * | * * * | * * * | * * * |
| 14 | 80 | ○ | 80 | ○ | 80 | ○ | 100 | ○ | 80 | Δ |
| 15 | 100 | ○ | 120 | ○ | 120 | ○ | 100 | ○ | 80 | ○ |
| 16 | 80 | ○ | 80 | ○ | 60 | ○ | 60 | ○ | * * * | * * * |

TABLE 4

| | 1,100° C. | | 1,200° C. | | 1,300° C. | | 1,400° C. | | 1,500° C. | |
|---|---|---|---|---|---|---|---|---|---|---|
| Oxidation Temperature Sample No. | O Diffusion Length | Al.B Diffusion Length | O Diffusion Length | Al.B Diffusion Length | O Diffusion Length | Al.B Diffusion Length | O Diffusion Length | Al.B Diffusion Length | O Diffusion Length | Al.B Diffusion Length |
| 1 | 65 | * * * | 30 | * * * | 70 | * * * | 110 | * * * | 150 | * * * |
| 2 | 55 | 5 | 25 | 15 | 35 | 20 | 60 | 55 | 90 | 65 |
| 3 | 45 | 5 | 30 | 20 | 40 | 35 | 80 | 75 | 95 | 95 |
| 4 | 40 | 5 | 35 | 20 | 40 | 40 | 85 | 90 | 100 | 95 |
| 5 | 40 | 10 | 35 | 25 | 45 | 50 | 95 | 90 | 110 | 100 |
| 6 | 50 | 15 | 50 | 25 | 50 | 75 | 100 | 110 | 120 | 145 |
| 7 | 90 | 20 | 15 | 30 | 60 | 100 | 120 | 110 | 130 | 150 |
| 8 | 65 | 3 | 20 | 5 | 35 | 10 | 70 | 65 | 90 | 95 |
| 9 | 65 | 4 | 30 | 10 | 45 | 45 | 85 | 75 | 90 | 100 |
| 10 | 50 | 10 | 40 | 20 | 60 | 60 | 90 | 85 | 95 | 100 |
| 11 | 55 | 15 | 50 | 25 | 70 | 75 | 85 | 95 | 100 | 110 |
| 12 | 75 | 30 | 75 | 40 | 85 | 90 | 90 | 100 | 105 | 0 |
| 13 | 110 | 90 | 95 | 95 | 100 | 95 | 100 | 110 | 110 | 120 |
| 14 | 50 | 10 | 45 | 10 | 30 | 25 | 40 | 45 | 70 | 75 |
| 15 | 45 | 15 | 85 | 15 | 60 | 55 | 85 | 75 | 90 | 80 |
| 16 | 100 | 20 | 95 | 50 | 90 | 95 | 90 | 100 | 110 | 100 |

As shown in Tables 2 and 4, depending on the amounts of A1 and B added and the heat-treating temperature, the range in which varistor characteristics with high a are exhibited changes. Such a change in the range depends on the diffusion lengths of oxygen, A1 and B from the surfaces.

When the heat-treating temperature is decreased, since SiC is oxidized first to form $SiO_2$, the apparent diffusion length of oxygen from the surfaces increases. Therefore, the varistor voltage is easily increased. As the varistor voltage is increased, $\alpha$ is also decreased, which is quite different from the object of the present invention. The upper limit of the diffusion length of oxygen was about 100 nm. However, since oxidation does not easily proceed beyond a certain level, and since the vaporization of SiO2 advances as the temperature is increased, the diffusion length of oxygen is not proportional to the oxidation temperature. When the amounts of A1 and B added are increased, the oxides thereof are dissolved into the $SiO_2$ which covers the SiC surface, and thus the oxidation of SiC is inhibited. However, the varistor voltage is easily increased as the amounts of A1 and B added are increased.

A1 and B form compounds with $SiO_2$ and tend to diffuse into SiC from those compounds. If the diffusion length of A1 or B exceeds about 5 nm, $\alpha$ is increased ($\alpha \geqq 15$), and if the diffusion further proceeds, $\alpha$ significantly high $\alpha$ can be obtained in the SiC varistor. However, if the diffusion length exceeds about 100 nm, $\alpha$ starts to decrease.

In Example 1, using the observed results by the $\mu$-SAM, the composition from the surfaces of SiC particles to the depth of 10 nm was also observed. The results thereof are shown in Table 5.

As is seen in Tables 2 and 5, when the element ratio Si:(A1B) is about 1:(0.5 to 3), an $\alpha$ of 20 or more can be obtained. The amounts of A1 and B added do not correspond to the element ratios of A1 and B in the surfaces of SiC particles. The reason for this is that the A1 and B added are not entirely homogeneous in the surfaces of SiC particles, and because of agglomeration, etc., particles other than SiC are formed. In Example 1, excess A1 and B react with $SiO_2$ and portions thereof act as binders for particles.

As is seen in Tables 3 and 5, at the element ratio described above, the surge current capacity and the ESD susceptibility are increased. The criterion of the surge current capacity was set at 60 A or more, and the criterion of the ESD susceptibility was determined as a change of varistor voltage of 5% or less.

As is obvious from the above, if the required amounts of A1 and B are supplied to the surfaces of SiC particles and oxidation was performed appropriately, it is possible to fabricate an SiC varistor having a high surge current capacity and high ESD susceptibility.

TABLE 5

| Sample | S:Al.B Ratio, 1:x, at an Oxidation Temperature (° C.) of | | | | |
|---|---|---|---|---|---|
| No. | 1,100 | 1,200 | 1,300 | 1,400 | 1,500 |
| 1 | *** | *** | *** | *** | *** |
| 2 | 0.3 | 0.1 | 0.1 | 0.1 | 0.1 |
| 3 | 0.5 | 0.5 | 0.5 | 0.4 | 0.3 |
| 4 | 1.0 | 0.8 | 0.5 | 0.5 | 0.3 |
| 5 | 1.4 | 1.0 | 0.7 | 0.5 | 0.5 |
| 6 | 3.0 | 2.8 | 2.6 | 2.2 | 2.2 |
| 7 | 4.2 | 3.8 | 3.2 | 2.8 | 2.8 |
| 8 | 0.4 | 0.4 | 0.3 | 0.3 | 0.1 |
| 9 | 0.6 | 0.5 | 0.5 | 0.5 | 0.4 |
| 10 | 0.8 | 0.6 | 0.5 | 0.5 | 0.4 |
| 11 | 1.2 | 1.0 | 0.8 | 0.7 | 0.6 |
| 12 | 2.8 | 2.5 | 2.3 | 2.2 | 2.0 |
| 13 | 3.8 | 3.5 | 3.1 | 2.7 | 2.5 |
| 14 | 0.6 | 0.6 | 0.5 | 0.5 | 0.4 |
| 15 | 1.1 | 0.9 | 0.7 | 0.6 | 0.6 |
| 16 | 2.9 | 2.7 | 2.4 | 2.3 | 2.1 |

EXAMPLE 2

Figure 3:
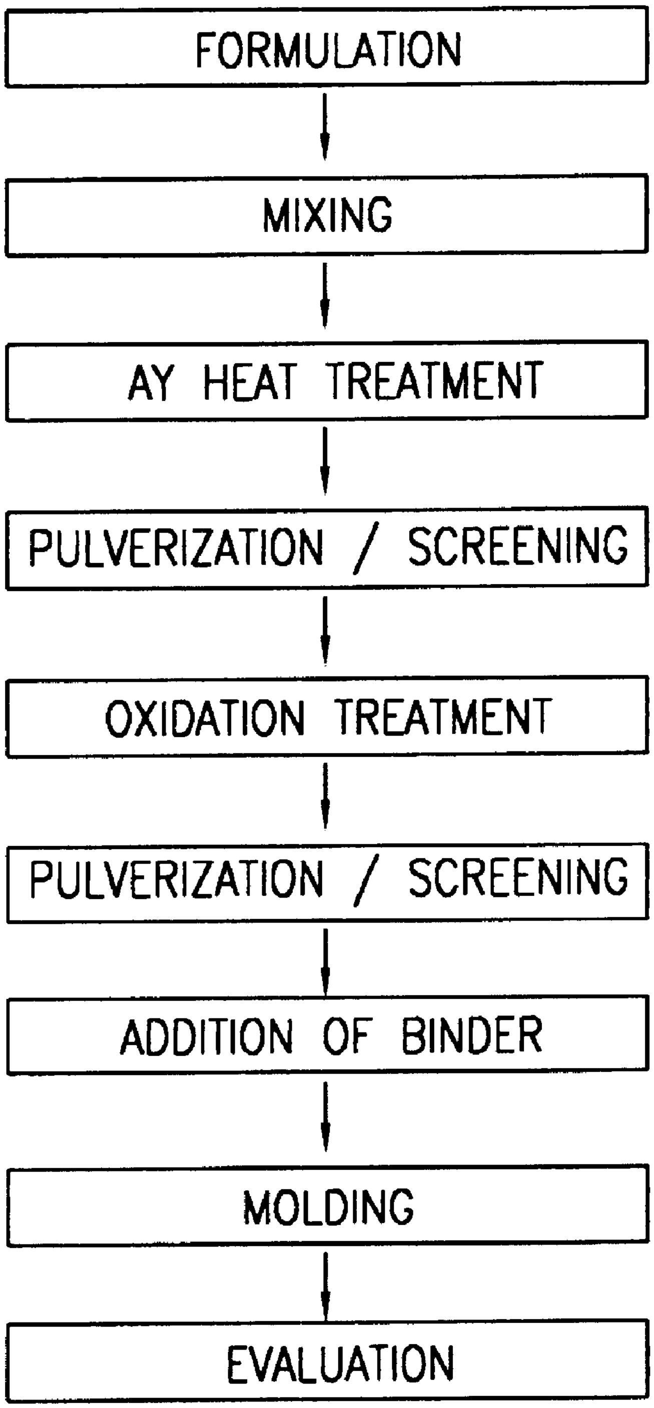
FIG. 3 is a flow chart showing a fabrication method in a second example.

As shown in the flow chart of FIG. 3, to n-type semiconductive β-SiC powder doped with 4,000 ppm of N as a dopant, having a particle size of 2 μm, boric acid and metallic aluminum were added so as to satisfy the A1 and B contents shown in Table 6. An organic solvent was added to the mixed powder and wet mixing was performed. The resultant mixed slurry was dried to remove the solvent, and then in order to form SiC particles based on the SiC powder and to diffuse A1 and B into the surfaces of the SiC particles, a heat treatment was performed in an Ar atmosphere at 800 to 1,500° C. Furthermore, surface oxidation treatment was performed on the SiC particles in an SiC oxidizing atmosphere at 1,300° C., and the resultant powder was subjected to pulverization/screening. Hereinafter, the powder is referred to as voltage nonlinear powder. After an organic binder was mixed to the voltage nonlinear powder, a pressure of 3 t/$cm^2$ was applied to produce a columnar compact with a diameter of 4 mm and a thickness of 0.25 mm.

After the compact was hardened at 100 to 200° C., a Ag-based electrode paste was applied to the upper and lower surfaces of the compact to fabricate a varistor provided with a pair of input/output electrodes, and then varistor characteristics were evaluated.

The evaluation method for the voltage nonlinear resistor was the same as that in Example 1, and measurements were taken at a capacitance of 1 MHZ.

Table 7 shows the measurement results of the voltage nonlinear coefficient α. The oxidation temperature for samples was fixed at 1,300° C.

TABLE 6

| Sample No. | SiC (parts by weight) | Al (parts by weight) | B (parts by weight) |
|---|---|---|---|
| 1 | 100 | 3 | 0 |
| 2 | 100 | 5 | 0 |
| 3 | 100 | 7 | 0 |
| 4 | 100 | 10 | 0 |
| 5 | 100 | 15 | 0 |
| 6 | 100 | 20 | 0 |
| 7 | 100 | 0 | 3 |
| 8 | 100 | 0 | 5 |
| 9 | 100 | 0 | 7 |
| 10 | 100 | 0 | 10 |
| 11 | 100 | 0 | 15 |
| 12 | 100 | 0 | 20 |

TABLE 7

| | Ar Heat Treatment Temperature | | | | | |
|---|---|---|---|---|---|---|
| Sample No. | Untreated | 800° C. | 1,000° C. | 1,300° C. | 1,400° C. | 1,500° C. |
| 1 | 40.6 | 50.3 | 30.8 | 30.5 | 33.0 | 40.1 |
| 2 | 23.3 | 25.3 | 36.6 | 34.3 | 32.1 | 55.8 |
| 3 | Unmeasurable | 30.0 | 50.1 | 46.2 | 28.6 | 60.0 |
| 4 | Unmeasurable | 30.1 | 40.2 | 36.1 | 45.1 | 70.3 |
| 5 | Unmeasurable | Unmeasurable | Unmeasurable | 52.7 | 50.9 | 45.3 |
| 6 | Unmeasurable | Unmeasurable | 38.1 | 28.0 | 22.8 | 50.0 |
| 7 | 30.0 | 22.4 | 35.1 | 32.0 | 22.0 | 30.6 |
| 8 | 40.1 | 41.0 | 32.1 | 62.0 | 32.9 | 42.6 |
| 9 | Unmeasurable | 30.1 | 24.9 | 41.0 | 43.1 | 44.2 |
| 10 | 20.0 | Unmeasurable | 20.4 | 50.1 | 24.9 | 36.8 |
| 11 | Unmeasurable | 25.5 | 34.2 | 45.0 | 41.0 | 41.2 |
| 12 | Unmeasurable | Unmeasurable | 28.0 | 28.3 | 50.0 | 30.1 |

As is seen in Table 7, when the heat treatment is performed in an Ar atmosphere as preliminary treatment to the oxidation treatment, a higher nonlinearity can be obtained in the broad range of the amount added in comparison with the case in which an Ar heat treatment is not performed. With respect to the sample shown as "Unmeasurable" in Table 7, discharge occurred between device electrodes when the current and the voltage were measured, and thus varistor characteristics were not obtained. This is due to inhomogeneous dispersion of the A1 and B added, and oxides of A1 and B generated in the oxidation process are believed to be included between SiC particles to completely insulate the particle boundaries.

With respect to the dispersibility of A1 and B in the powder which was subjected to Ar heat treatment, the dispersibility into SiC particles was improved. In contrast, in the powder which was not subjected to Ar heat treatment, A1 and B segregated inhomogeneously, exhibiting unsatisfactory dispersibility. As is obvious from the results, by performing heat treatment in an Ar atmosphere before oxidation treatment is performed, it is possible to improve the dispersibility of additives, thus stabilizing the characteristics.

As described above, when voltage nonlinear powder is formed, in view of characteristic stability, heat treatment is preferably performed in an Ar atmosphere at 800 to 1,500° C. before oxidation treatment is performed.

EXAMPLE 3

As shown in Table 8, 5 types of SiC powder having different particle sizes were prepared. Each of A1 and B was added to the powder in the amount of 5 parts by weight relative to 100 parts by weight of SiC. Next, using the mixed powder, a voltage nonlinear powder was formed in the same manner as that in Example 2, and samples to be evaluated were obtained. The heat-treating temperature in an Ar atmosphere was set at 1,500° C., and the oxidation treatment was performed at 1,300° C. for 2 hours.

TABLE 8

| Sample No. | SiC Average Particle Size (μm) |
|---|---|
| 13 | 0.3 |
| 14 | 1.0 |
| 15 | 3.5 |
| 16 | 12.4 |
| 17 | 30.5 |
| 18 | 67.2 |

Figure 4:
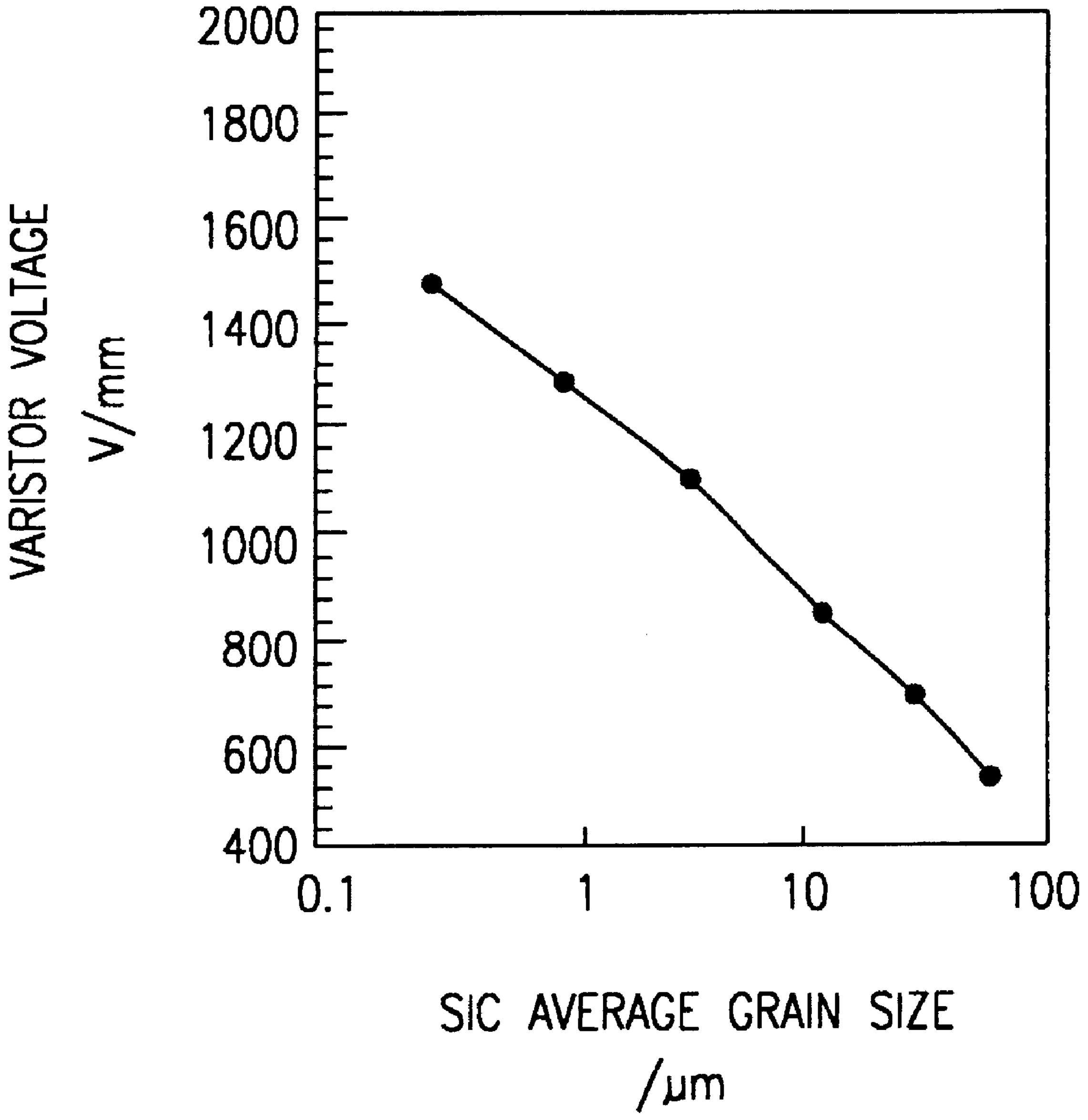
FIG. 4 is a graph showing the relationship between the varistor voltage and the SiC particle size in a third example.

The varistor characteristics of the samples were measured. As shown in FIG. 4, it was conformed that as the SiC particle size was increased, the varistor voltage was decreased. Consequently, it is possible to control the varistor voltage by controlling the SiC particle size. However, use of SiC particles having an average particle size exceeding about 70 μm causes a problem in view of molding, resulting in a difficulty in the formation of the device. When SiC particles having an average particle size of less than about 0.3 μm are used, particles easily agglomerate during the Ar heat treatment and oxidation, resulting in variations in the particle size of voltage nonlinear powder, thus affecting the variations and stability of varistor characteristics. Therefore, the average particle size of SiC particles used for the voltage nonlinear resistor is preferably about 0.3 to 70 μm.

As described above, in the voltage nonlinear resistor of the present invention, the apparent relative dielectric constant is lower than that of the ZnO-based varistor by approximately 2 orders of magnitude, and the voltage nonlinear coefficient is increased, and also the surge current capacity and the ESD susceptibility are increased.

In accordance with the fabrication method of the present invention, it is possible to obtain a voltage nonlinear resistor in which the apparent relative dielectric constant is lower than that of the ZnO-based varistor by approximately 2 orders of magnitude and the voltage nonlinear coefficient is equal to that of the ZnO varistor. In particular, by performing heat treatment in an Ar atmosphere, it is possible to easily obtain a voltage nonlinear resistor having stable characteristics.

Furthermore, the SiC varistor of the present invention is a varistor obtained by modifying the surfaces of SiC particles and combining the individual SiC particles. Therefore, by molding using a resin or the like as a binder, it is possible to easily obtain a varistor having superior characteristics. As a characteristic of the varistor having such a structure, it is possible to form various shapes, and it is possible to use it as a protecting device from static electricity.

By controlling the particle size of SiC particles, it is possible to obtain a varistor voltage $V_{0.1mA}$ of approximately 500 to 1,000 V/mm, and thus a voltage nonlinear resistor having a low varistor voltage can be obtained.

What is claimed is:

1. A voltage nonlinear resistor comprising an aggregate of doped silicon carbide particles having oxygen and at least one of aluminum and boron diffused into the surface of the silicon carbide particles, the diffusion length of the oxygen from the surface of the silicon carbide particles being about 100 nm or less, and the diffusion length of the aluminum and boron present from the surface of the silicon carbide particles being in the range of about 5 to 100 nm.

2. A voltage nonlinear resistor according to claim 1, wherein the diffusion length of the oxygen from the surface of the silicon carbide particles is in the range of about 25 to 85 nm.

3. A voltage nonlinear resistor according to claim 2, wherein the diffusion length of the aluminum and boron present from the surface of the silicon carbide particles is in the range of about 25 to 70 nm.

4. A voltage nonlinear resistor according to claim 3, wherein the element ratio of the silicon to the aluminum and boron present within the area from the surface of the silicon carbide particles to about 10 nm from the surface of the silicon carbide particles is about 1:0.5 to 3.

5. A voltage nonlinear resistor according to claim 4, wherein the average particle size of the silicon carbide particles is in the range of about 0.3 to 70 μm.

6. A varistor comprising a voltage nonlinear resistor according to claim 5 sandwiched between a pair of input/output electrodes.

7. A voltage nonlinear resistor according to claim 4, wherein the average particle size of the silicon carbide particles is in the range of about 1 to 30 μm and wherein both A1 and B are present.

8. A varistor comprising a voltage nonlinear resistor according to claim 7 sandwiched between a pair of input/output electrodes.

9. A voltage nonlinear resistor according to claim 1, wherein the diffusion length of the aluminum and boron present from the surfaces of the silicon carbide particles is in the range of about 25 to 70 nm.

10. A voltage nonlinear resistor according to claim 1, wherein the element ratio of the silicon to the aluminum and boron present within the area from the surface of the silicon carbide particles to about 10 nm from the surface of the silicon carbide particles is about 1:0.5 to 3.

11. A voltage nonlinear resistor according to claim 1, wherein the average particle size of the silicon carbide particles is in the range of about 0.3 to 70 μm.

12. A voltage nonlinear resistor according to claim 1, wherein the silicon carbide particles are n-type semiconductive doped.

13. A varistor comprising a voltage nonlinear resistor according to claim 1 sandwiched between a pair of input/output electrodes.

* * * * *